(12) United States Patent
Choi et al.

(10) Patent No.: US 11,329,157 B2
(45) Date of Patent: May 10, 2022

(54) TWO-TERMINAL BIRISTOR WITH POLYSILICON EMITTER LAYER AND METHOD OF MANUFACTURING THE SAME

(71) Applicant: Korea Advanced Institute of Science and Technology, Daejeon (KR)

(72) Inventors: Yang-Kyu Choi, Daejeon (KR); Jun Woo Son, Daejeon (KR); Jae Hur, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 22 days.

(21) Appl. No.: 16/607,410

(22) PCT Filed: Aug. 20, 2019

(86) PCT No.: PCT/KR2019/010523
§ 371 (c)(1),
(2) Date: Oct. 23, 2019

(87) PCT Pub. No.: WO2020/040510
PCT Pub. Date: Feb. 27, 2020

(65) Prior Publication Data
US 2020/0328305 A1    Oct. 15, 2020

(30) Foreign Application Priority Data

Aug. 20, 2018   (KR) .......................... 10-2018-0096846

(51) Int. Cl.
*H01L 21/00*      (2006.01)
*H01L 29/78*      (2006.01)
(Continued)

(52) U.S. Cl.
CPC .... *H01L 29/7841* (2013.01); *H01L 21/02293* (2013.01); *H01L 21/02532* (2013.01);
(Continued)

(58) Field of Classification Search
None
See application file for complete search history.

(56) References Cited

U.S. PATENT DOCUMENTS 5,096,844 A * 3/1992 Konig ............... H01L 21/28525
257/586
5,262,670 A   11/1993 Lee et al.
(Continued)

FOREIGN PATENT DOCUMENTS

| KR | 101042521 B1 | 6/2011 | |
|----|--------------|--------|--|
| KR | 10-2014-0080741 A | 7/2014 | |
| KR | 20140080741 * | 7/2014 | ......... H01L 21/8242 |

*Primary Examiner* — Reema Patel
(74) *Attorney, Agent, or Firm* — Faegre Drinker Biddle & Reath LLP (57) ABSTRACT

A two-terminal biristor in which a polysilicon emitter layer is inserted and a method of manufacturing the same are provided. The method of manufacturing the two-terminal biristor according to an embodiment of the present disclosure includes forming a first semiconductor layer of a first type on a substrate, forming a second semiconductor layer of a second type on the first semiconductor layer, forming a third semiconductor layer of the first type on the second semiconductor layer, and forming a polysilicon layer of the first type on the third semiconductor layer.

11 Claims, 6 Drawing Sheets

(51) Int. Cl.
*H01L 21/02* (2006.01)
*H01L 21/3205* (2006.01)
*H01L 27/108* (2006.01)
*H01L 29/861* (2006.01)

(52) U.S. Cl.
CPC .. *H01L 21/32055* (2013.01); *H01L 27/10802* (2013.01); *H01L 29/861* (2013.01)

(56) References Cited

U.S. PATENT DOCUMENTS

| | | | |
|---|---|---|---|
| 5,409,843 A * | 4/1995 | Yamauchi | H01L 21/3105 257/E21.241 |
| 5,869,881 A * | 2/1999 | Lee | H01L 29/1004 257/565 |
| 2008/0237637 A1 | 10/2008 | Ouyang et al. | |
| 2012/0092925 A1 | 4/2012 | Chen et al. | |
| 2017/0117326 A1 | 4/2017 | Boivin et al. | |

* cited by examiner

FIG. 1

--Prior Art--

FIG. 2

--Prior Art--

TWO-TERMINAL BIRISTOR WITH POLYSILICON EMITTER LAYER AND METHOD OF MANUFACTURING THE SAME

CROSS REFERENCE TO RELATED APPLICATIONS

This is a 35 U.S.C. § 371 U.S. National Stage Entry of International Application No. PCT/KR2019/010523, filed on Aug. 20, 2019, which claims priority to Korean Patent Application No. 10-2018-0096846, filed on Aug. 20, 2018, the contents of which are incorporated herein by reference.

TECHNICAL FIELD

The present disclosure relates to a two-terminal biristor, and more particularly, to a two-terminal biristor where a polysilicon layer is inserted between an emitter semiconductor region and a metallic layer to increase a current gain, to decrease a latch-up voltage and a latch-down voltage, and to increase a latch voltage window, and a method of manufacturing the same.

BACKGROUND ART

A unit cell of a conventional DRAM memory has a structure (1T/1C) including one transistor "T" and one capacitor "C". In a case of a memory device, increasing the number of cells per unit area brings excellent commercial and economic effects. Therefore, miniaturization of cells is the biggest problem to be solved in a memory industry. For miniaturization of the cells, reducing a size of the transistor or capacitor in the conventional DRAM cell structure has been a key technology of the memory industry. As technology has advanced, miniaturization of the transistor has been solved, but miniaturization of the capacitor while maintaining capacitance has faced a technical limitation. To this end, a capacitorless DRAM (a DRAM without a capacitor) has been proposed. In the capacitorless DRAM, the unit cell includes only one transistor without the capacitor, which is advantageous for miniaturization of the cell. That is, miniaturization of the cell leads to have a high degree of integration and a manufacturing process is simple to be advantageous to commercialization. However, in a case of the capacitorless DRAM, deterioration of a gate insulating layer occurs because a high driving voltage is required to write and read the memory state, which causes a fatal problem in reliability and durability among memory operation characteristics.

DETAILED DESCRIPTION OF THE INVENTION

Technical Problem

Embodiments of the present disclosure provide a two-terminal biristor in which a polysilicon layer is inserted between an emitter semiconductor region and a metallic layer to increase a current gain, decrease a latch-up voltage and a latch-down voltage, and increase a latch voltage window, and a method of manufacturing the same.

Technical Solution

A method of manufacturing a two-terminal biristor according to an embodiment of the present disclosure includes forming a first semiconductor layer of a first type on a substrate, forming a second semiconductor layer of a second type on the first semiconductor layer, forming a third semiconductor layer of the first type on the second semiconductor layer, and forming a polysilicon layer of the first type on the third semiconductor layer.

In addition, the method of manufacturing the two-terminal biristor according to an embodiment of the present disclosure may further include forming an insulting layer electrically separating an active semiconductor region of the first to third semiconductor layers, and forming a first metallic layer electrically connected to the first semiconductor layer and a second metallic layer electrically connected to the polysilicon layer.

When the first and third semiconductor layers and the polysilicon layer are formed of an N-type, and the second semiconductor layer is formed of a P-type, valence band energies of the first and third semiconductor layers and the polysilicon layer may be lower than a valence bad energy of the second semiconductor layer, and a conduction band energy of the second semiconductor layer may be higher than conduction band energies of the first and third semiconductor layers and the polysilicon layer.

When the first and third semiconductor layers and the polysilicon layer are formed of a P-type and the second semiconductor layer is formed of an N-type, valence band energies of the first and third semiconductor layers and the polysilicon layer may be higher than a valence band energy of the second semiconductor layer, and a conduction band energy of the second semiconductor layer may be lower than conduction band energies of the first and third semiconductor layers and the polysilicon layer.

In the forming of the first and third semiconductor layers and the polysilicon layer, the first and third semiconductor layers and the polysilicon layer may be formed through an ion implantation.

In the forming of the first and third semiconductor layers and the polysilicon layer, the first and third semiconductor layers and the polysilicon layer may be formed through an epitaxial growth or a selective epitaxial growth.

In the forming of the first and third semiconductor layers and the polysilicon layer, the first and third semiconductor layers and the polysilicon layer may be formed to have energy band gaps larger than an energy band gap of the second semiconductor layer.

In the forming of the first and third semiconductor layers and the polysilicon layer, the first and third semiconductor layers and the polysilicon layer may be formed using at least one of silicon, strained silicon, germanium, strained germanium, silicon germanium, and silicon carbide.

The substrate may include at least one of a silicon wafer, a strained silicon wafer, a germanium wafer, a strained germanium wafer, and a silicon germanium wafer and may include at least one of a silicon on insulator wafer, a strained silicon on insulator wafer, a germanium on insulator wafer, a strained germanium on insulator wafer, and a silicon germanium on insulator wafer.

A two-terminal biristor according to an embodiment of the present disclosure includes a first semiconductor layer of a first type formed on a substrate, a second semiconductor layer of a second type formed on the first semiconductor layer, a third semiconductor layer of the first type formed on the second semiconductor layer, and a polysilicon layer of the first type formed on the third semiconductor layer.

Furthermore, the two-terminal biristor according to an embodiment of the present disclosure may further include a first metallic layer electrically connected to the first semiconductor layer, a second metallic layer electrically connected to the polysilicon layer, and an insulting layer electrically separating an active semiconductor region of the first to third semiconductor layers from the first and second metallic layers.

When the first and third semiconductor layers and the polysilicon layer are formed of an N-type, and the second semiconductor layer is formed of a P-type, valence band energies of the first and third semiconductor layers and the polysilicon layer may be lower than a valence bad energy of the second semiconductor layer, and a conduction band energy of the second semiconductor layer may be higher than conduction band energies of the first and third semiconductor layers and the polysilicon layer.

When the first and third semiconductor layers and the polysilicon layer are formed of a P-type and the second semiconductor layer is formed of an N-type, valence band energies of the first and third semiconductor layers and the polysilicon layer may be higher than a valence band energy of the second semiconductor layer, and a conduction band energy of the second semiconductor layer may be lower than conduction band energies of the first and third semiconductor layers and the polysilicon layer.

The first to third semiconductor layers may be formed of at least one of silicon, strained silicon, germanium, strained germanium, silicon germanium, and silicon germanium.

The substrate may include at least one of a silicon wafer, a strained silicon wafer, a germanium wafer, a strained germanium wafer, a silicon germanium wafer, a silicon on insulator wafer, a strained silicon on insulator wafer, a germanium on insulator wafer, a strained germanium on insulator wafer, and a silicon germanium on insulator wafer.

A two-terminal biristor according to an embodiment of the present disclosure includes a semiconductor layer formed at an emitter region, and a polysilicon layer formed on the semiconductor layer.

Advantageous Effects of the Invention

According to embodiments of the present disclosure, a polysilicon layer may be inserted between an emitter semiconductor region and a metallic layer to increase a current gain, decrease a latch-up voltage and a latch-down voltage, and increase a latch voltage window.

According to embodiments of the present disclosure, the current gain may be increased, the latch-up voltage and the latch-down voltage may be decreased, and the latch voltage window may be increased to implement a biristor enabling low power driving. Therefore, a device which is highly usable as a memory device such as a DRAM memory may be provided.

Mobility of holes is lower in N-type polysilicon than N-type single crystal silicon. Lower mobility results in a lower diffusion constant and a larger emitter Gummel number in polysilicon. Thus, a hole current density of the emitter is lowered and the current gain which is inversed proportional to the hole current density is increased.

According to embodiments of the present disclosure, since the polysilicon layer is inserted, the current gain may be increased to decrease the latch-up voltage and the latch-down voltage and increase the latch voltage window.

BEST MODE

Advantages and features of the present disclosure, and methods for achieving them will be apparent from the following embodiments that will be described in more detail with reference to the accompanying drawings. However the present disclosure is not limited to the following embodiments and may be implemented in various forms. In addition, the embodiments complement the disclosure of the present disclosure and are provided for a person skilled in the art to fully understand the scope of the present disclosure, and the present disclosure is defined only by the appended claims.

The terms are only used to describe embodiments and not to limit the scope of the present disclosure. Herein, the singular forms are intended to include the plural forms as well, unless the context clearly indicates otherwise. The terms "comprises" and/or "comprising", when used herein, specify the presence of stated features, integers, steps, operations, and/or components, but do not preclude the presence or addition of one or more other features, integers, steps, operations, and/or components.

Unless otherwise defined, all terms (including technical and scientific terms) used herein have the same meaning as commonly understood by those skilled in the art to which the inventive concept pertains. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

Hereinafter, embodiments of the present disclosure will be described in detail with reference to the accompanying drawings. Like reference numerals refer to like elements throughout, and also, their detailed descriptions will be omitted.

A two-terminal biristor (a bi-stable resistor) is a device exhibiting bi-stable operation characteristics, which has an N-type-P-type-N-type semiconductor junction or a P-type-N-type-P-type semiconductor junction and an N-type semiconductor or a P-type semiconductor is electrically floated. Since the biristor having the above-described structure does not have a capacitor and a gate, it is possible to fundamentally solve a reliability problem caused by a gate insulating layer deterioration which occurs in a DRAM. In addition, when the two-terminal biristor is manufactured to have a vertical type, a degree of integration is higher in comparison with a conventional DRAM. Furthermore, a manufacturing process is simple to drastically reduce a process cost. Therefore, it is advantages to commercialization and the DRAM currently used may be replaced.

An operation principle of the biristor is that electrons are injected from an emitter region to a base region when a voltage is applied to a collector region, and the injected electrons cause impact ionization due to a high electric field to generate hole pairs. The generated electrons go out the collection region, and the holes are trapped in the base region which is electrically floated to be accumulated. A potential of the base region decreases due to the accumulated holes to lower a potential barrier between the emitter region and the base region and to allow more electrons to enter the base. Therefore, more impact ionization occurs and a positive feedback in which more hole pairs occur is generated. When an appropriate voltage is applied to the collector region of the two-terminal biristor operated by the above-described positive feedback, an avalanche effect causes the collector region to change a low current state ('0' state) to a high current state ('1' state) where a current increases rapidly. In addition, when the voltage is lowered to an appropriate level, the positive feedback structure is broken and the high current state is changed to the low current state where the current is sharply lowered. Here, a latch-up voltage is referred to as a voltage when changing from a low current state to a high current state and a latch-down voltage is referred to as a voltage when changing from a high current state to a low current state. Hysteresis occurs due to a phenomenon of the latch-up and the latch-down, and a difference between the latch-up voltage and the latch-down voltage is referred to as a latch voltage window. The smaller the latch-up voltage, the larger the latch voltage window, the greater the useful value as a memory. In addition, a latch-up phenomenon, which is a sudden increase in current, occurs when $(M-1) \cdot \beta \approx 1$ is satisfied. Here, 'M' may a multiplication factor, and 'β' may mean a current gain.

Embodiments of the present disclosure provide the two-terminal biristor in which a polysilicon layer is inserted between an emitter semiconductor region and a metallic layer which are used in a two-terminal to increase the current gain, thereby lowering the latch-up voltage and latch-down voltage and increasing the latch voltage window.

Here, the two-terminal biristor of the present disclosure may have a vertical structure.

Figure 1:
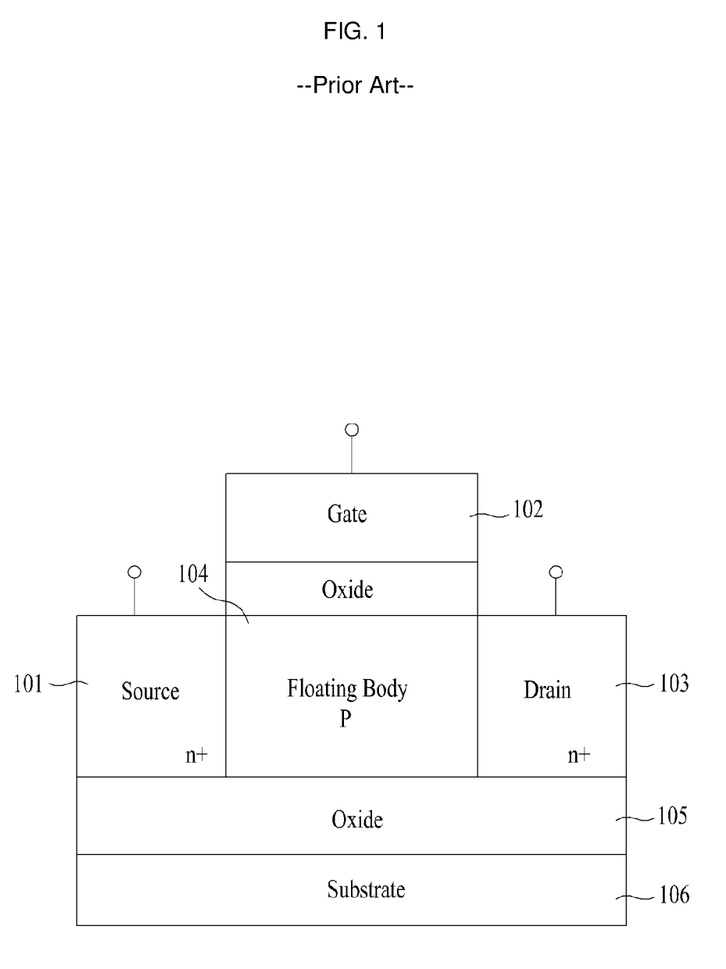
FIG. 1 is a view illustrating a structure of a conventional capacitorless DRAM.

FIG. 1 is a view illustrating a structure of a conventional capacitorless DRAM.

Referring to FIG. 1, the conventional DRAM has a structure in which an oxide 105 is formed on a substrate 106, a source 101, a floating body 104, and a drain 103 are formed on the oxide 205, and an oxide and a gate 102 are formed on the floating body 104. The source 101, the drain 103, and the gate 102 are electrically connected to the outside, but the floating body 104 is electrically floated because the oxides are disposed at a bottom and a top of the floating body 104 and the source 101 and the drain 103 are disposed at opposite sides of the floating body 104. The source 101, the floating body 104, and the drain 103 may be n, p, n-type or p, n, p-type semiconductors, but the case of n, p, n-type will be described as an example.

The conventional capacitorless DRAM may use an impact ionization effect for a writing method. That is, when a positive voltage is applied to the drain 103 and a positive voltage is also applied to the gate 102, electrons are injected through the source 101, and the injected electrons generate the impact ionization effect due to a strong electric field near the drain 103. Electrons and holes are generated by the impact ionization effect.

Since the electrons and holes generated between the floating body 104 and the drain 103 tend to go to a low energy state, the electrons flows to the drain 103 and the holes flows to the floating body 104. Here, when an energy band gap of the floating body 104 is designed to be smaller than energy band gaps of the source 101 and the drain 103, a contact potential of the electrons is larger than a contact potential of the holes at a contact potential between the floating body 104 and the drain 103. Therefore, the holes coming from the drain 103 to the floating body 104 are accumulated and very few holes pass to the source 101.

More details of the conventional capacitorless DRAM may be described through Korean Patent KR 10-1042521.

Figure 2:
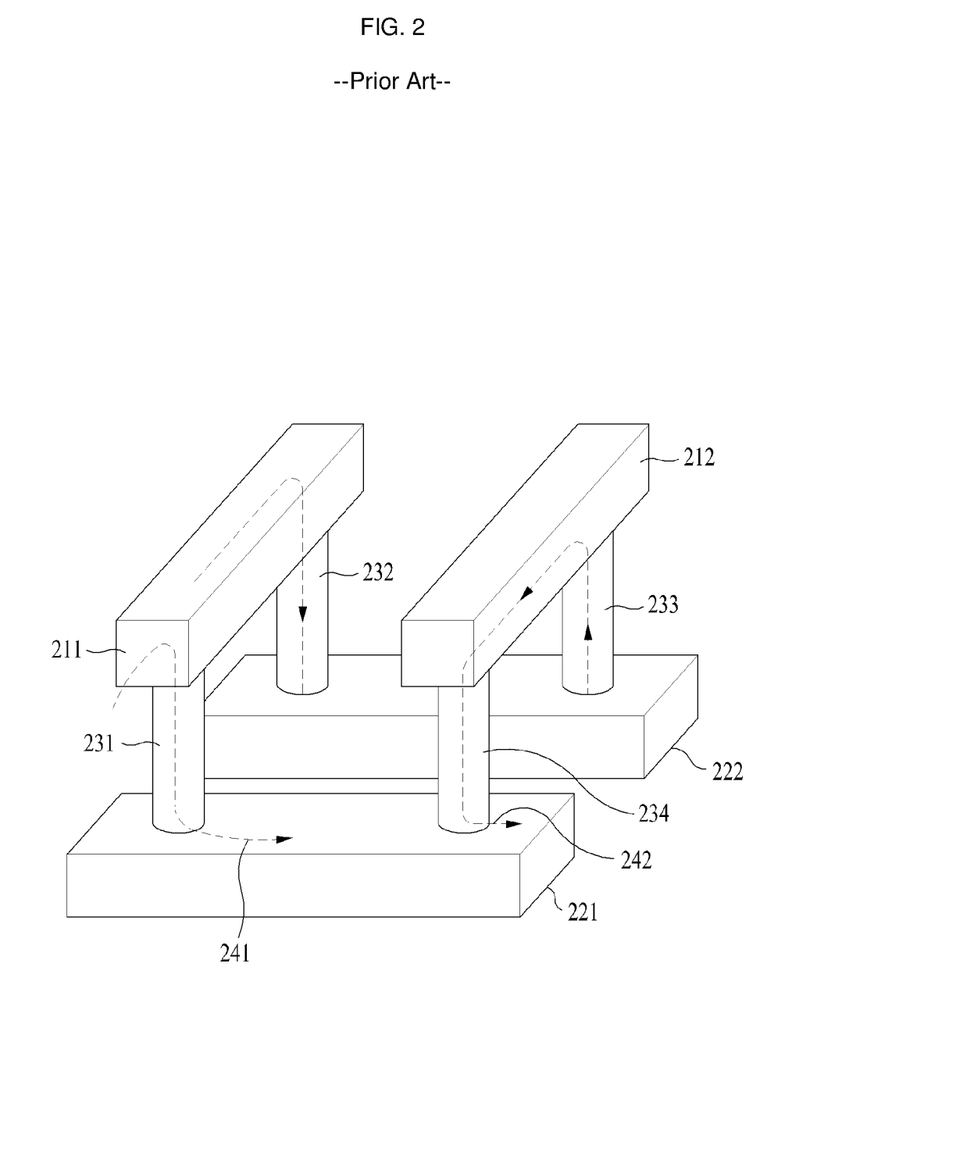
FIG. 2 is a view illustrating a leakage current between adjacent cells in a conventional DRAM.

FIG. 2 is a view illustrating a leakage current between adjacent cells in a conventional DRAM.

FIG. 2 shows a portion of a memory array and four cells 231, 232, 233, and 234, word lines 211 and 212, bit lines 221 and 222, a data current 241, a leakage current 242.

The data current 241 generated when a voltage is applied to the word line 211 has information about the first cell 231. When gaps between the four cells 231, 232, 233, and 234 are narrow and the second, third, and fourth cells 232, 233, and 234 are in a low resistance state, the leakage current 242 passing through the second, third, and fourth cells 232, 233, and 234 passes through the bit line 221. Here, since the data current 241 representing the information about the first cell 231 and the leakage current 242 are combined to flow through the bit line 221, there is a problem the information about the first cell 231 is not known exactly when the combined current is measured.

Conventionally, when the array is formed, a diode is added to prevent the leakage current, but the biristor device according to the present disclosure may prevent a reverse current from flowing through asymmetrical doping, thereby solving the problem of the leakage current due to the adjacent cells.

Figure 3:
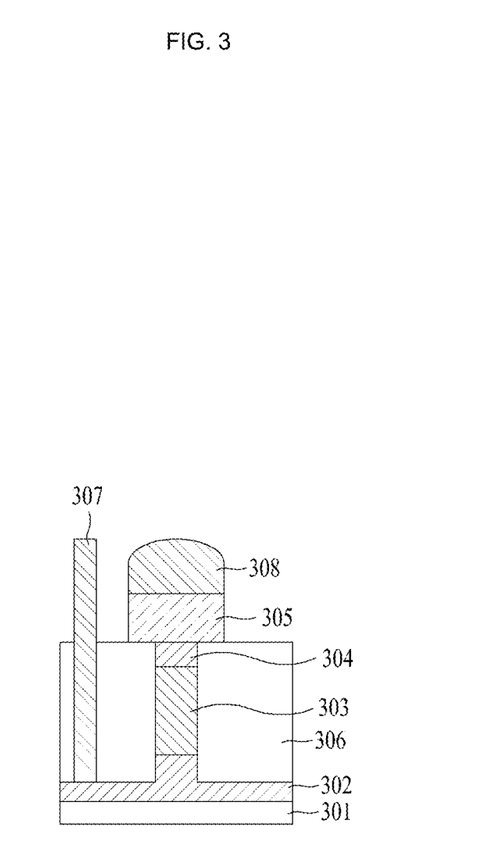
FIG. 3 is a view illustrating a structure of a two-terminal biristor according to an embodiment of the present disclosure.

FIG. 3 is a view illustrating a structure of a two-terminal biristor according to an embodiment of the present disclosure.

Referring to FIG. 3, the two-terminal biristor includes a substrate 301, a first semiconductor layer 302, a second semiconductor layer 303, a third semiconductor layer 304, a polysilicon layer 305, an insulating layer 306, a first metallic layer 307, and a second metallic layer 308.

In a conventional horizontal DRAM, there is a limit that an area of a unit cell is $8F^2$ or $6F^2$ due to horizontal characteristics. However, the two-terminal biristor according to the present disclosure may have a vertical structure, and when the two-terminal biristor has the vertical structure, the area of the unit cell may be $4F^2$.

The substrate 301 is a substrate for manufacturing the two-terminal biristor of the present disclosure, a bulk wafer may be used as the substrate 301, or a wafer on insulator in which an insulating layer is buried may be used as the substrate 301.

For example, the substrate 301 may use one of a silicon wafer, a strained silicon wafer, a germanium wafer, a strained germanium wafer, and a silicon germanium wafer, and one of a silicon on insulator (SOI) wafer, a strained silicon on insulator (SSOI) wafer, a germanium on insulator (GOI) wafer, a strained germanium on insulator (SGOI) wafer and a silicon germanium on insulator wafer.

The wafer may be manufactured using at least one of a Czochralski method, a floating zone method, a Bridgman method, a casting method, and an electro-magnetic casting (EMC) method.

Here, a germanium-based material having a band gap smaller than silicon (a band gap about 1.12 eV) may be used as the substrate 301. The band gap energy is the minimum energy for electrons in a valence band to be excited into a conduction band. When the electrons of the valence band which are fixed by a nucleus receive the band gap energy and are excited into the conduction band, the electrons move freely and become free electrons and affect a current flow. That is, when the biristor is formed of germanium having the band gap energy smaller than the band gap of silicon, a large current may flow through the biristor even when a small voltage is applied to an electrode. Therefore, the biristor may be advantageous for making a low power device.

The insulating layer 306 is formed in an upper region of the first semiconductor layer 302 to electrically separate the first metallic layer 307 and the second metallic layer 308 from an active semiconductor region by the first to third semiconductor layers 302, 303, and 304.

Here, the insulating layer 306 may include any one of a solid oxide layer (oxide), a nitride layer (nitride, etc.), and a dielectric layer having a low dielectric constant (low-k).

The first metallic layer 307 may be electrically connected to the first semiconductor layer 302 to apply an external voltage to the first semiconductor layer 302, and the second metallic layer 308 may be electrically connected to the polysilicon layer 305 to apply an external voltage to the third semiconductor layer 304 through the polysilicon layer 305.

That is, the external voltage may be applied to each of the first semiconductor layer 302 and the third semiconductor layer 304 and thus, the current may flow in the semiconductor. The external voltage is not directly applied to the second semiconductor layer 303, which is in a floating state.

The first semiconductor layer 302 is formed on an upper part of the substrate 301, the second semiconductor layer 303 is formed on a portion of an upper part of the first semiconductor layer 302, and the third semiconductor layer 304 2 is formed on an upper part of the second semiconductor layer 303.

Here, the first to third semiconductor layers 302, 303, and 304 may be formed through an epitaxial growth, a selective epitaxial growth, or an ion implantation.

The epitaxial growth may be a process of growing a layer having the same crystal structure as the semiconductor substrate on the semiconductor substrate, and may include, for example, physical vapor deposition (PVD), chemical vapor deposition (CVD), metal-organic chemical vapor deposition (MOCVD), and atomic layer deposition (ALD).

The selective epitaxial growth is a process of exposing a specific region of the semiconductor substrate and growing a layer having the same crystal structure in the exposed region. The selective epitaxial growth is easy to manufacture a semiconductor device having a three-dimensional structure.

The polysilicon layer 305 is formed on the upper part of the third semiconductor layer 304 and a portion of an upper part of the insulating layer 306.

Here, the polysilicon layer 305 may be formed through the ion implantation, and may be a semiconductor of the same type as the third semiconductor layer 304. For example, when the third semiconductor layer 304 is an N-type semiconductor, the polysilicon layer 305 is also an N-type semiconductor, and when the third semiconductor layer 304 is a P-type semiconductor, the polysilicon layer 305 may also be a P-type semiconductor.

The first semiconductor layer 302, the third semiconductor layer 304, and the polysilicon layer 305 are a different type of semiconductor from the second semiconductor layer 303. For example, when the first semiconductor layer 302, the third semiconductor layer 304, and the polysilicon layer 305 are P-type semiconductors, the second semiconductor layer 303 is an N-type semiconductor, and when the first semiconductor layer 302, the third semiconductor layer 304, and the polysilicon layer 305 are N-type semiconductors, the second semiconductor layer 303 may be a P-type semiconductor.

Here, when the first semiconductor layer 302, the third semiconductor layer 304, and the polysilicon layer 305 are formed of an N-type, and the second semiconductor layer 303 is formed of a P-type, valence band energies of the first semiconductor layer 302, the third semiconductor layer 304, and the polysilicon layer 305 may be lower than a valence band energy of the second semiconductor layer 303, and a conduction band energy of the second semiconductor layer 303 may be higher than conduction band energies of the first semiconductor layer 302, the third semiconductor layer 304, and the polysilicon layer 305. In addition, when the first semiconductor layer 302, the third semiconductor layer 304, and the polysilicon layer 305 are formed of a P-type, and the second semiconductor layer 303 is formed of an N-type, the valence band energies of the first semiconductor layer 302, the third semiconductor layer 304, and the polysilicon layer 305 may be higher than the valence band energy of the second semiconductor layer 303, and the conduction band energy of the second semiconductor layer 303 may be lower than the conduction band energies of the first semiconductor layer 302, the third semiconductor layer 304, and the polysilicon layer 305.

Furthermore, the first semiconductor layer 302, the third semiconductor layer 304, and the polysilicon layer 305 may be formed to have higher energy band gaps than the second semiconductor layer 303.

The first to third semiconductor layers 302, 303, and 304 may formed using at least one of silicon, strained silicon, germanium, strained germanium, silicon germanium, and silicon carbide, or a combination of these materials.

Furthermore, the second semiconductor layer 303 may include a first region and a second region having different doping concentrations. The second semiconductor layer 303 includes the first region and the second region having the different doping concentrations to prevent the leakage current problem due to the adjacent cells. For example, when the first semiconductor layer 302 and the third semiconductor layer 304 are formed of an N-type, the second semiconductor layer 303 is formed of a P-type, and the first and second regions are formed of $P^+$ and $P^0$, respectively, currents representing date '0' and '1' may flow when the first semiconductor layer is grounded and a voltage is applied to the third semiconductor layer 304. In contrast, when the third semiconductor layer 304 is grounded and a voltage is applied to the first semiconductor layer 302, no current flows regardless of the voltage. Since the values of the multiplication factor 'M' of the impact ionization and the current gain 'β' are varied depending on the two bias conditions, the current flowing through the device is changed depending on the bias conditions. That is, since the reverse bias causes the current not to flow, the leakage current 242 rather than the data current 241 may be prevented from flowing.

Furthermore, when materials having different band gap energies are repeatedly formed or a ratio of Ge in a compound structure of SiG is adjusted to form the second semiconductor layer 303, the second semiconductor layer 303 may form an energy well which accumulates charges by changing the band gaps.

Here, the second semiconductor layer 303 may be formed of a III-IV compound and at least one material of Si and Ge.

Examples of structures forming energy wells (or quantum wells) may include a GaN/InGaN stacked structure, InAs/$In_{1-x}Ga_xAs$ (e.g., InAs/$In_{0.8}Ga_{0.2}As$), $Al_xGa_{1-x}As$/GaAs (e.g., $Al_{0.2}Ga_{0.8}As$/GaAs) and Si/$Si_{1-x}Ge_x$ (e.g., Si/$Si_{0.8}Ge_{0.2}$), where the 'x' value may mean a value for controlling content concentration.

One embodiment is a two-terminal structure in which a gate and an insulating layer are removed from a conventional three-terminal device having a gate, a source, and a drain. Electron-hole pairs may be formed by the impact ionization to indicate a '1' state. When additional holes or electrons accumulate in the second semiconductor layer, a low resistance state may occur, and thus a high current may flow to indicate a '1' state. A specific bias voltage may be applied between the first and third semiconductor layers 302 and 304 to indicate a '0' state. Since the specific bias voltage causes a high resistance state due to disappearance of the additional holes or electrons in the second semiconductor layer 303, a low current may flow to indicate a '0' state. Since two resistance states are maintained depending on the bias, the device according to the present disclosure may be defined as a bistable resistor (biristor). Here, a DRAM capable of determining whether the data is stored based on the current difference between the two states may be implemented.

Figure 4A:
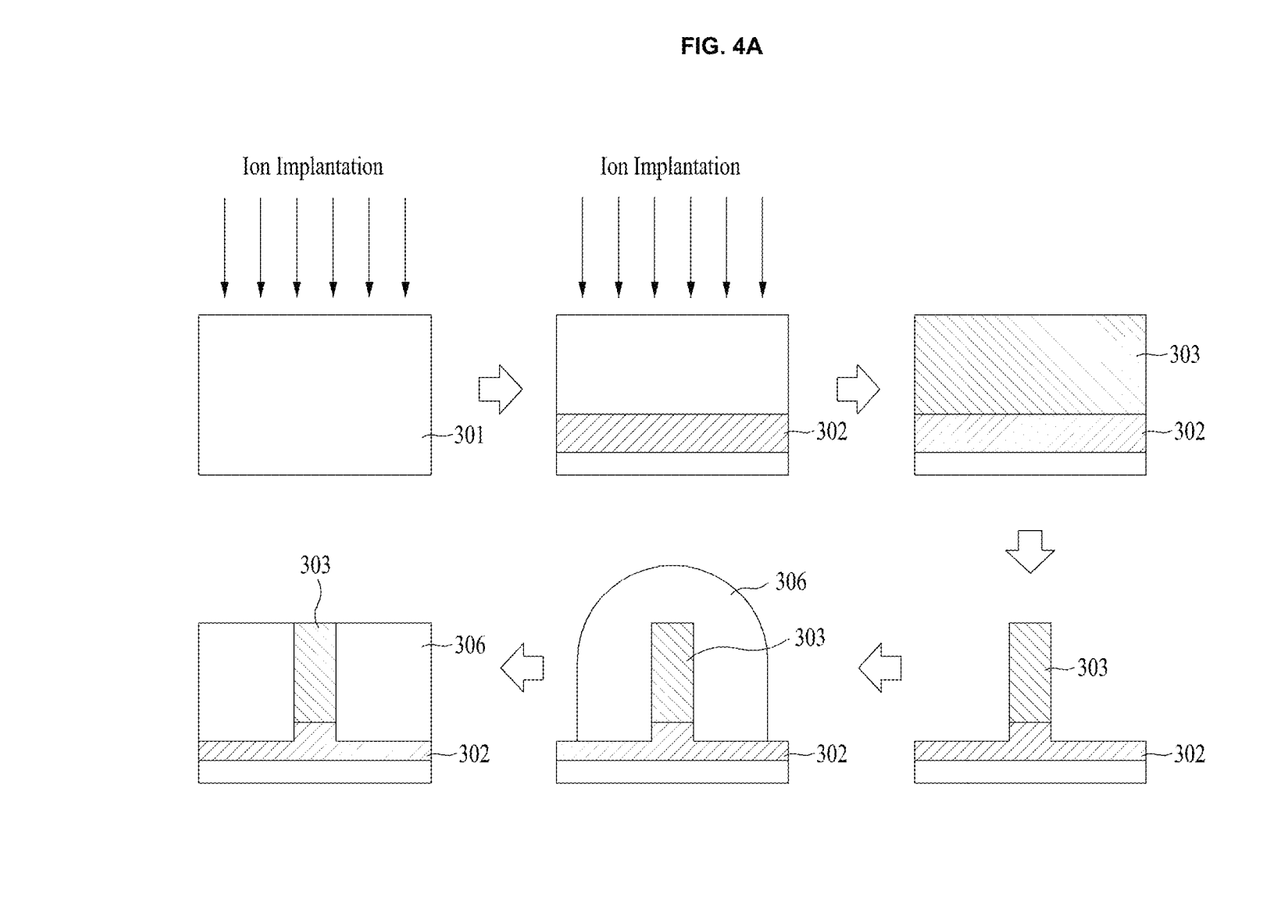
FIGS. 4A and 4B are views illustrating a method of manufacturing a two-terminal biristor according to an embodiment of the present disclosure.
Figure 4B:
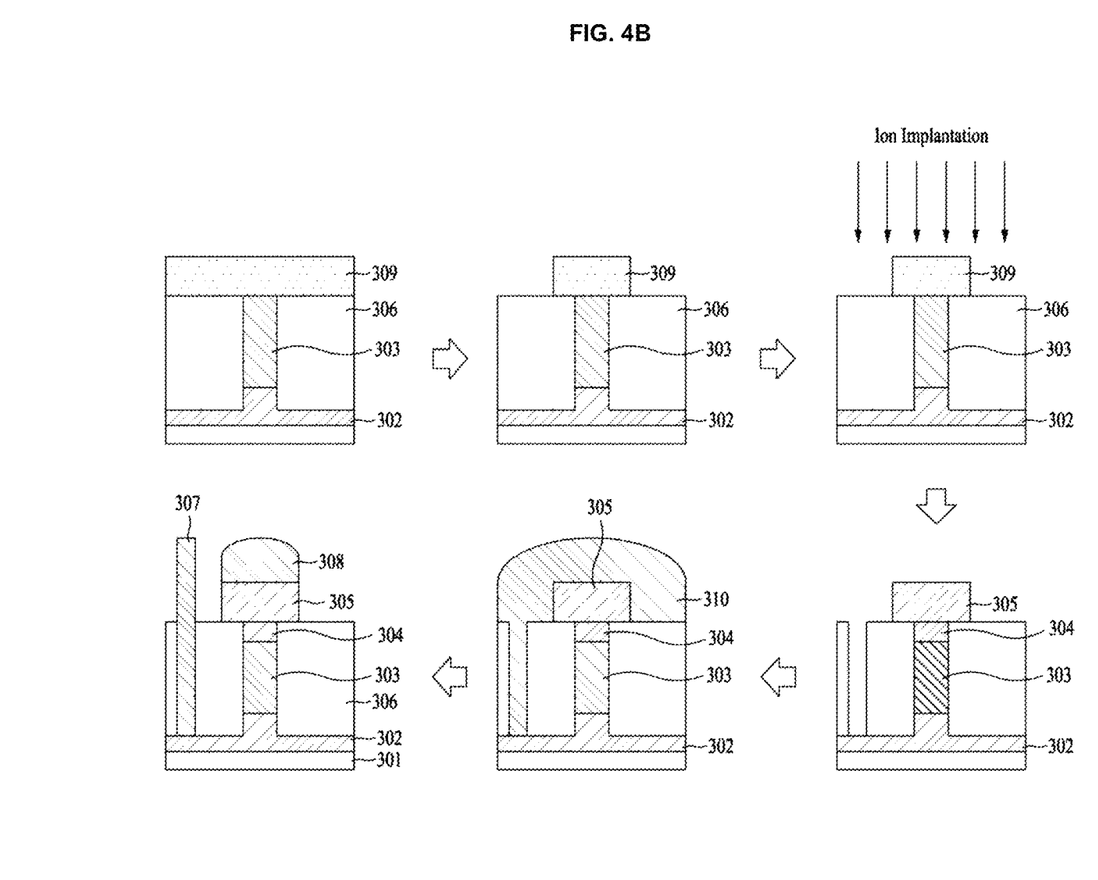

FIGS. 4A and 4B are views illustrating a method of manufacturing a two-terminal biristor according to an embodiment of the present disclosure.

As illustrated in FIGS. 4A and 4B, the method of manufacturing the two-terminal biristor of the present disclosure includes sequentially forming the first semiconductor layer 302 and the second semiconductor layer 303 on the substrate 301 through the ion implantation. For example, using an ion implantation method, first type impurities, for example, N-type impurities are implanted into the substrate by the ion implantation method to form the N-type first semiconductor layer 302, and then second type impurities, for example, P-type impurities are additionally implanted into the substrate to form the P-type second semiconductor layer 303 on an upper part of the N-type first semiconductor layer 302.

Here, the substrate 301 may use one of a silicon wafer, a strained silicon wafer, a germanium wafer, a strained germanium wafer, and a silicon germanium wafer, and one of a silicon on insulator (SOI) wafer, a strained silicon on insulator (SSOI) wafer, a germanium on insulator (GOI) wafer, a strained germanium on insulator (SGOI) wafer, and a silicon germanium on insulator wafer.

Here, acceleration energy of the ion implantation and dose amounts of the impurities may be adjusted to sequentially form the first and second semiconductor layers 302 and 303 which are different from each other. After the ion implantation for forming an N-P-type semiconductor layers, an etching process for forming a vertical device structure is performed.

Here, patterning and etching processes may be included to form the first and second semiconductor layers 302 and 303 having the vertical structure. For example, a photoresist (PR) may be deposited on a hard mask, and then patterned by electron beam lithography, and an active semiconductor layer may be formed by a dry etching. Here, a lower portion of the first semiconductor layer 302 may be left during the etching process to be used as a common electrode when the cells are arrayed. The patterning process may be a method of recording nano-scale circuit patterns, such as an X-ray lithography, in addition to the electron beam lithography. Hereinafter, a description will be given of a case where the first to third semiconductor layers of FIG. 4 are formed of an N-P-N-type.

After the etching for forming the vertical structure, the insulating layer 306 is formed to protect the N-P-type vertical semiconductor layers 302 and 303. Here, the insulating layer 306 is formed of any one of various dielectric layers to electrically separate the first and second metallic layers 307 and 308 from the active semiconductor region formed by the first to third semiconductor layers 302, 303, and 304.

After the insulating layer 306 is formed, a surface planarization is performed to form a precise semiconductor device. Here, a chemical-mechanical planarization (CMP) may be used as the planarization method. After the planarization, a polysilicon layer 309 is formed. The polysilicon layer 309 may be formed using the chemical vapor deposition method rather than the epitaxial growth method to reduce the process cost and to improve throughput. After the polysilicon layer is formed, an etching process is performed to make the polysilicon layer 309 into a landing pad. Forming the landing pad with the polysilicon layer may reduce mis-alignment and ensure a process margin for the landing pad.

After the etching, the N-type third semiconductor layer 304 and the N-type polysilicon layer 305 are formed through the ion implantation, thereby forming an N-P-N-N layer structure. After the ion implantation, thermal annealing may be added to N (the first semiconductor layer)-P (the second semiconductor layer)-N(the third semiconductor layer)-N (the polysilicon layer) to activate the implanted impurities and to adjust distribution of the implanted impurities to a desired shape. When the N-type polysilicon layer is deposited by an in-situ deposition instead of the ion implantation, the number of processes may be decreased to reduce the process cost and an interrupt junction may be formed to maximize characteristics In the above-described process, at least one of the epitaxial growth, the selective epitaxial growth, and the ion implantation may be used as a method of forming the first to third semiconductor layers. Here, when the semiconductor layers are formed through the ion implantation method, different types of semiconductor layers may be formed by adjusting the acceleration energy of the ion implantation and the dose amounts of the impurities. In addition, the annealing may be provided to activate the implanted ions and to adjust the distribution of the implanted ions to the desired shape. The annealing is a method of cooling the semiconductors relatively slowly after heating the semiconductors at a high temperature for a specific time. Furthermore, when forming the second semiconductor layer, a doping concentration of the lower portion of the second semiconductor layer may be lower than a doping concentration of the upper portion of the second semiconductor layer. The doping concentrations are varied, and thus the current may flow only in a desired direction, thereby preventing the generation of unwanted current under influence of the adjacent cells.

After forming the N (the first semiconductor layer)-P (the second semiconductor layer)-N(the third semiconductor layer)-N(the polysilicon layer) structure, a metallic layer 310 for transmitting electrical signals from the outside is formed. That is, a portion of the insulating layer 306 is etched to expose a portion of the first semiconductor layer 302 to be electrically connected to the first semiconductor layer 302, and then the metallic layer 310 is deposited. The metallic layer 310 is etched to form the first metallic layer 307 and the second metallic layer 308 from the metallic layer 310, which is formed the entire upper part of the insulating layer 306. Of course, the etching process may use a mask, PR, etc., and these technical matters are obvious to those skilled in the art. Through this process, the N-type first semiconductor layer of a bottom of the active semiconductor region of the vertical structure is connected to the first metallic layer to form one terminal, and the N-type polysilicon layer of a top of the vertical structure is connected to the second metallic layer to form the other terminal. In particular, the P-type second semiconductor layer is not connected to the metallic layers and maintains an electrically floating state. The first and second metallic layers are formed to complete the biristor device of a vertical two-terminal structure into which the polysilicon emitter layer is inserted.

Here, when the first and third semiconductor layers and the polysilicon layer are formed of N-type, and the second semiconductor layer is formed of the P-type, the valence band energies of the first and third semiconductor layers and the polysilicon layer may be lower than the valence bad energy of the second semiconductor and the conduction band energy of the second semiconductor layer may be higher than the conduction band energies of the first and third semiconductor layers and the polysilicon layer. In addition, when the first and third semiconductor layers and the polysilicon layer are formed of the P-type and the second semiconductor layer is formed of the N-type, the valence band energies of the first and third semiconductor layers and the polysilicon layer may be higher than the valence band energy of the second semiconductor layer, and the conduction band energy of the second semiconductor layer may be lower than the conduction band energies of the first and third semiconductor layers and the polysilicon layer. That is, in the present disclosure, when the first and third semiconductor layers and the polysilicon layer are formed of the N-type and the second semiconductor layer is formed of the P-type, the first and third semiconductor layers and the second semiconductor layer may be formed of materials, in which the valence band energies of the first and third semiconductor layers and the polysilicon layer are lower than the valence bad energy of the second semiconductor and the conduction band energy of the second semiconductor layer is higher than the conduction band energies of the first and third semiconductor layers and the polysilicon layer. In addition, when the first and third semiconductor layers and the polysilicon layer are formed of the P-type and the second semiconductor layer is formed of the N-type, the first and third semiconductor layers and the second semiconductor layer may be formed of materials, in which the valence band energies of the first and third semiconductor layers and the polysilicon layer are higher than the valence band energy of the second semiconductor layer and the conduction band energy of the second semiconductor layer is lower than the conduction band energies of the first and third semiconductor layers and the polysilicon layer.

The semiconductor material used in the two-terminal biristor of the present disclosure may include at least one of silicon (Si), germanium (Ge, SiGe), a III-V compound, a 2-D material (at least one of carbon nanotube, MoS2, graphene etc.).

In addition, both a polysilicon emitter region and the semiconductor region are formed by the ion implantation of the impurities of one of N-type or P-type at $5 \times 10^{18}$ cm$^{-3}$ or more. Here, a base semiconductor region may be formed at $1 \times 10^{17}$ cm$^{-3}$ or more and $1 \times 10^{19}$ cm$^{-3}$ or less.

Figure 5:
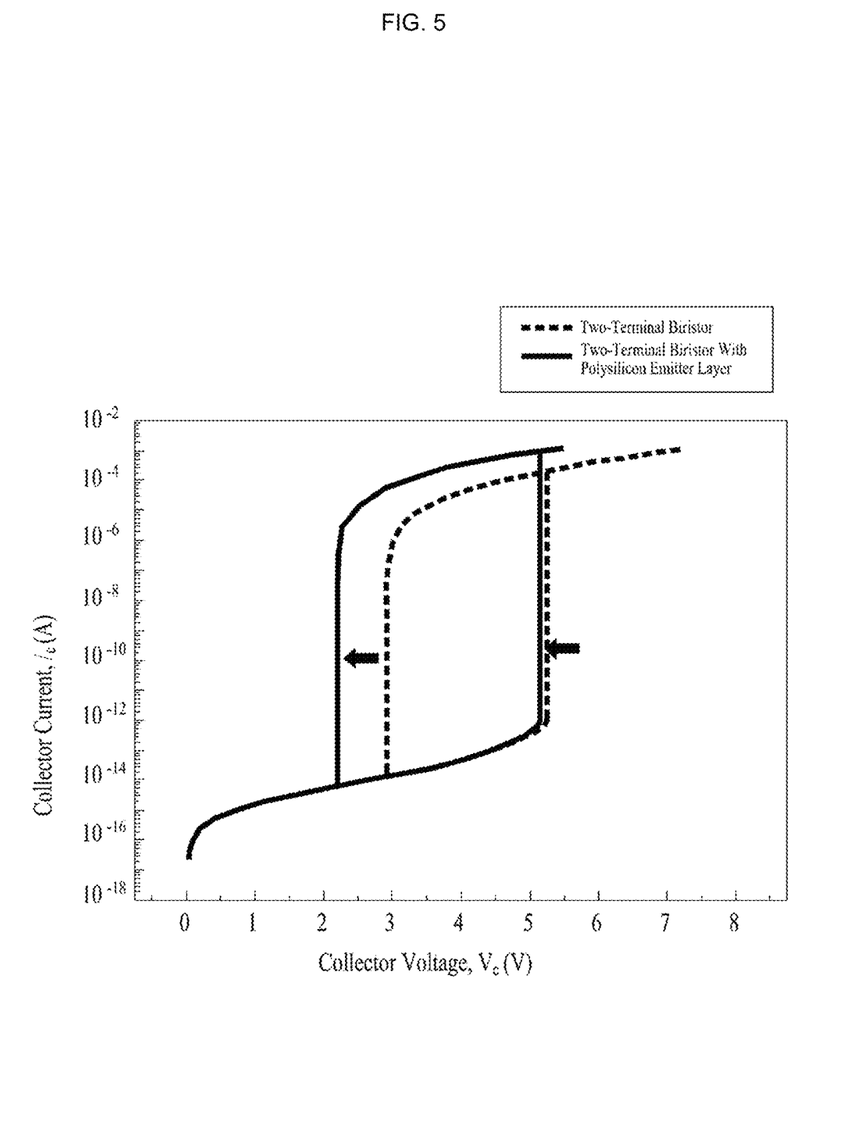
FIG. 5 shows a current-voltage curve of a two-terminal biristor according to the present disclosure.

FIG. 5 shows a current-voltage curve of a two-terminal biristor according to the present disclosure. FIG. 5 shows the current-voltage curve before and after the polysilicon emitter layer is inserted.

As illustrated in FIG. 5, in the two-terminal biristor into which the polysilicon emitter layer is inserted according to the present disclosure, as the polysilicon emitter layer is inserted, it is shown that the current gain is increased, the latch-up voltage and the latch-down voltage are decreased, and the latch voltage window is increased to lower a voltage required to drive the memory, thereby enabling low power driving.

When the first, second, and third semiconductor layers are N, P, and N types, respectively and the voltage of the third semiconductor layer is increased, the impact ionization phenomenon is caused by the high electric field formed between the second and third semiconductor layers and the electron-hole pairs (EHPs) occur. Excess electrons pass through the second semiconductor layer to the third semiconductor layer, and a large current flows as a base-opened bipolar junction transistor (BJT) is in a breakdown region when the voltage is reached at a specific value. Here, a large value of current is maintained as long as the voltage of the specific value or more is applied. As the voltage is decreased, generation of the electron-hole pairs is decreased and the voltage is out of the breakdown region and thus, a small current flows. Since the voltage (the latch-down voltage) which is out of the breakdown region becomes smaller than the voltage (the latch-up voltage) at which the breakdown region occurs, bistable current-voltage characteristics are provided between the latch-up voltage and the latch-down voltage. A state in which excess holes are accumulated in the second semiconductor layer or a state in which the excess holes are not accumulated in the second semiconductor layer may be detected between the latch-up voltage and the latch-down voltage. The large or small current may flow depending on the accumulated state of excess carriers to distinguish whether the stored data is in the "1" state or the "0" state.

That is, when a positive voltage is applied to the third semiconductor layer and the first semiconductor layer is grounded, as illustrated in FIG. 5, a drain current does not flow until the voltage reaches the latch-up voltage and when the voltage reaches the latch-up voltage, the drain current rapidly increases due to the impact ionization phenomenon. Here, a sudden increase in current occurs when the condition of $(M-1)*\beta \approx 1$ is satisfied. 'M' is the multiplication factor and represents a ratio between the current before the impact and the current due to the impact when the electron-hole pairs are generated by the impact ionization phenomenon to increase the current. '$\beta$' is the current gain and generally represents a ratio between a base current and a collector current in the bipolar junction transistor. The multiplication factor 'M' is increased in proportion to the voltage applied to the third semiconductor layer.

In addition, the two-terminal biristor of the present disclosure is not limited to the above description, and the polysilicon layer is inserted between the emitter semiconductor region and the metallic layer which constitute the two-terminal biristor to increase the current gain of the two-terminal biristor, to decrease the latch-up voltage and the latch-down voltage, and to increase the latch voltage window. Therefore, the present disclosure is not limited to the above-described two-terminal biristor structure, and may include all kinds of two-terminal biristors which form the polysilicon layer on the upper part of the emitter semiconductor region That is, the two-terminal biristor according to another embodiment of the present disclosure includes all kinds of two-terminal biristors including the semiconductor layer formed on the upper part of the emitter semiconductor region and the polysilicon layer formed on the upper part of the semiconductor layer. Of course, the above-described two-terminal biristor may include the metallic layer connected to the polysilicon layer, e.g., a metallic layer formed on the upper part of the polysilicon layer.

In addition, each semiconductor region constituting the two-terminal biristor may be the N-type semiconductor region or the P-type semiconductor region, each semiconductor region may have a doping concentration for any one type, but a plurality of regions having different doping concentrations may be included in one semiconductor region.

As described above, although the present disclosure is described by the limited embodiment and drawings, those skilled in the art will appreciate that various changes and modifications are possible, without departing from this disclosure. Therefore, exemplary embodiments of the present disclosure have not been described for limiting purposes. Accordingly, the scope of the disclosure is not to be limited by the above embodiments but by the claims and the equivalents thereof. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Therefore, other implements, other embodiments, and equivalents to claims are within the scope of the following claims.

The invention claimed is:

1. A method of manufacturing a two-terminal biristor, the method comprising:
   forming a first semiconductor layer of a first type on a substrate;
   forming a second semiconductor layer of a second type on the first semiconductor layer;
   depositing a polysilicon layer on the second semiconductor layer;
   forming, after depositing the polysilicon layer, a third semiconductor layer of the first type on the second semiconductor layer; and
   concurrently forming with forming the third semiconductor layer the polysilicon layer of the first type on the third semiconductor layer using an ion implantation.

2. The method of claim 1, further comprising:
   forming an insulting layer electrically separating an active semiconductor region of the first to third semiconductor layers; and
   forming a first metallic layer electrically connected to the first semiconductor layer and a second metallic layer electrically connected to the polysilicon layer.

3. The method of claim 1, wherein,
   valence band energies of the first and third semiconductor layers and the polysilicon layer are lower than a valence bad energy of the second semiconductor layer, and a conduction band energy of the second semiconductor layer is higher than conduction band energies of the first and third semiconductor layers and the polysilicon layer when the first and third semiconductor layers and the polysilicon layer are formed of an N-type, and the second semiconductor layer is formed of a P-type.

4. The method of claim 1, wherein,
   valence band energies of the first and third semiconductor layers and the polysilicon layer are higher than a valence band energy of the second semiconductor layer, and a conduction band energy of the second semiconductor layer is lower than conduction band energies of the first and third semiconductor layers and the polysilicon layer when the first and third semiconductor layers and the polysilicon layer are formed of a P-type and the second semiconductor layer is formed of an N-type.

5. The method of claim 1, wherein, in the forming of the first semiconductor layer, the first semiconductor layer is formed through an ion implantation.

6. The method of claim 1, wherein, in the forming of the first semiconductor layer, the first semiconductor layer is formed through an epitaxial growth or a selective epitaxial growth.

7. The method of claim 1, wherein, in the forming of the first and third semiconductor layers and the polysilicon layer, the first and third semiconductor layers and the polysilicon layer are formed to have energy band gaps larger than an energy band gap of the second semiconductor layer.

8. The method of claim 1, wherein, in the forming of the first and third semiconductor layers and the polysilicon layer, the first and third semiconductor layers and the polysilicon layer are formed using at least one of silicon, strained silicon, germanium, strained germanium, silicon germanium, or silicon carbide.

9. The method of claim 1, wherein the substrate includes at least one of a silicon wafer, a strained silicon wafer, a germanium wafer, a strained germanium wafer, or a silicon germanium wafer.

10. The method of claim 1, wherein the substrate includes at least one of a silicon on insulator wafer, a strained silicon on insulator wafer, a germanium on insulator wafer, a strained germanium on insulator wafer, or a silicon germanium on insulator wafer.

11. A two-terminal biristor manufactured by the method of claim 1.

* * * * *